United States Patent [19]
Hiotakakos et al.

[11] Patent Number: 5,459,750
[45] Date of Patent: * Oct. 17, 1995

[54] APPARATUS AND METHOD FOR DISCRIMINATING AND SUPPRESSING NOISE WITHIN AN INCOMING SIGNAL

[75] Inventors: Dimitris Hiotakakos; Mark A. Ireton, both of Manchester; Costas S. Xydeas, Cheshire, all of United Kingdom; John G. Bartkowiak; Safdar M. Asghar, both of Austin, Tex.

[73] Assignee: Advanced Micro Devices, Inc., Sunnyvale, Calif.

[*] Notice: The portion of the term of this patent subsequent to Nov. 29, 2011 has been disclaimed.

[21] Appl. No.: 280,297

[22] Filed: Jul. 26, 1994

Related U.S. Application Data

[63] Continuation of Ser. No. 887,470, May 22, 1992, abandoned.

[51] Int. Cl.[6] .................................................... H04B 1/10
[52] U.S. Cl. ........................ 375/351; 455/222; 455/296
[58] Field of Search ................................ 375/351, 346, 375/349; 455/212, 218, 219, 220, 221, 222, 223, 224, 225, 296, 303, 304, 305, 194.1

[56] References Cited

U.S. PATENT DOCUMENTS

| | | | |
|---|---|---|---|
| 4,411,021 | 10/1983 | Yoakum | 455/222 |
| 4,429,404 | 1/1984 | Mai | 375/104 |
| 4,648,127 | 3/1987 | Jongepier | 455/222 |
| 4,704,736 | 11/1987 | Kasser | 455/225 |
| 4,972,510 | 11/1990 | Guizerix et al. | 375/104 |
| 5,161,185 | 11/1992 | Hochschild | 455/222 |
| 5,369,791 | 11/1994 | Asghar et al. | 455/222 |

Primary Examiner—Stephen Chin
Assistant Examiner—Hai H. Phan
Attorney, Agent, or Firm—Foley & Lardner

[57] ABSTRACT

An apparatus and method for discriminating and suppressing noise within an incoming signal including a first signal processor to generate a first signal representing the incoming signal; a second signal processor to generate a second signal representing the first signal; a prediction device which generates a prediction for the second signal; a logic device which determines the difference between the second signal and the prediction and generates a logic output having a first value when the difference exceeds a threshold and a second value when the difference does not exceed the threshold; and a muting device to mute the incoming signal when the logic output has one value and not mute the incoming signal when the logic output has the other value. The method includes the steps of (1) generating a first signal representing the average signal energy of the incoming signal; (2) generating a second signal representing the first signal normalized with respect to a maximum signal energy expected; (3) generating a prediction for the second signal; (4) determining a difference between the second signal and the prediction; (5) generating a control signal having a first value when the difference exceeds a threshold and a second value when the difference does not exceed the threshold; and (6) providing a muting device which responds to the control signal to mute the incoming signal when the control signal has one value and not mute the incoming signal when the control signal has the other value.

30 Claims, 3 Drawing Sheets

APPARATUS AND METHOD FOR DISCRIMINATING AND SUPPRESSING NOISE WITHIN AN INCOMING SIGNAL

This is a continuation of application Ser. No. 07/887,470 filed May 22, 1992 abandoned.

CROSS REFERENCE TO RELATED APPLICATIONS

The following applications contain subject matter similar to the subject matter of this application:

U.S. application Ser. No. 07/887,076, filed May 22, 1992, Attorney Docket Number 204 928, entitled "Improved Apparatus and Method for Discriminating and Suppressing Noise within an Incoming Signal".

U.S. application Ser. No. 07/887,469, filed, May 22, 1992, Attorney Docket Number 204 978, entitled "Apparatus and Method for Attenuating a Received Signal in Response to Presence of Noise".

BACKGROUND OF THE INVENTION

In certain types of communications systems, such as systems employed with wireless telephone systems, information conveyed via analog signalling is received by a receiver in a series of encoded representations of information, generally in the form of a series of "1"'s and "0"'s established via frequency shift keying (FSK) at high frequency. Such transmissions may be subject to reflection such as from buildings and other objects in the transmission path, so there are sometimes radio frequency (RF) signals arriving at a receiver which are time-delayed with respect to other received signals in a manner which may interrupt or distort reception. As a result, the demodulator (or decoder) of the receiver may erroneously convert received signals, thereby becoming unstable and producing interference. Such interference is generally perceived by a user of such a system in the form of popping or clicking sounds or other distracting noises.

It is common in the communications industry to compensate for interference or other noise by providing a feedback circuit with a delay whereby one can estimate the noise component of the received signal, generate a duplicate approximation of the noise component, and subtract that approximate noise component from the original signal to eliminate the noise received in the incoming signal. However, an industry standard published for wireless telephones and similar systems requires that no delays be introduced in such systems; i.e., the system must be what is commonly known as a real-time system. Consequently, a solution for eliminating noise in such a system must likewise be a real-time system.

The present invention provides a real-time noise discriminating and suppressing system designed to quickly discriminate and suppress noise in an incoming signal.

SUMMARY OF THE INVENTION

The present invention includes an apparatus for discriminating and suppressing noise within an incoming signal which includes a first signal processing device for processing the incoming signal to generate a first iteration signal which represents specified aspects of the incoming signal. The apparatus further includes a second signal processing device which processes the first iteration signal to generate a second iteration signal representative of specified aspects of the first iteration signal; a prediction device which generates a predicted value for the second iteration signal from a plurality of earlier samples of the second iteration signal; a logic device which determines the difference between the second iteration signal and the predicted value and generates a logic output which has a first value when the difference exceeds a predetermined threshold value and has a second value when the difference does not exceed the predetermined threshold value. The apparatus further includes a muting device for muting signals which is operatively connected to receive the incoming signal and the logic output; the muting device responds to the logic output to mute the incoming signal when the logic output is at one of the first or second values and to not mute the incoming signal when the logic output is at the other of the first value and the second value.

A further aspect of the present invention includes a method for discriminating and suppressing noise within an incoming signal. The method includes the steps of (1) generating a first iteration signal representative of the average signal energy of the incoming signal; (2) generating a second iteration signal which is representative of the first iteration signal normalized with respect to a maximum signal energy expected of the incoming signal; (3) generating a predicted value for the second iteration signal from a plurality of earlier samples of the second iteration signal; (4) determining a difference between the second iteration signal and the predicted value; (5) generating a control signal which has a first value when the difference exceeds a predetermined threshold value and has a second value when the difference does not exceed the predetermined threshold value; and (6) providing a muting device for muting signals which is operatively connected to receive the incoming signal and the control signal and responds to the control signal to mute the incoming signal when the control signal is at one of the first value and second value and to not mute the incoming signal when the control signal is at the other of the first value and second value.

In its preferred embodiment, the method of the present invention generates the first iteration signal according to the relationship:

$$\epsilon_t = \frac{1}{n} \sum_{i=1}^{n} s_i^2$$

where $\epsilon_t$=average signal energy, $s_i$=sample of the incoming signal, and n=number of samples.

Further objects and features of the present invention will be apparent from the following specification and claims when considered in connection with the accompanying drawings illustrating the preferred embodiment of the invention.

DETAILED DESCRIPTION OF THE DRAWINGS

DETAILED DESCRIPTION OF THE INVENTION

Figure 1:
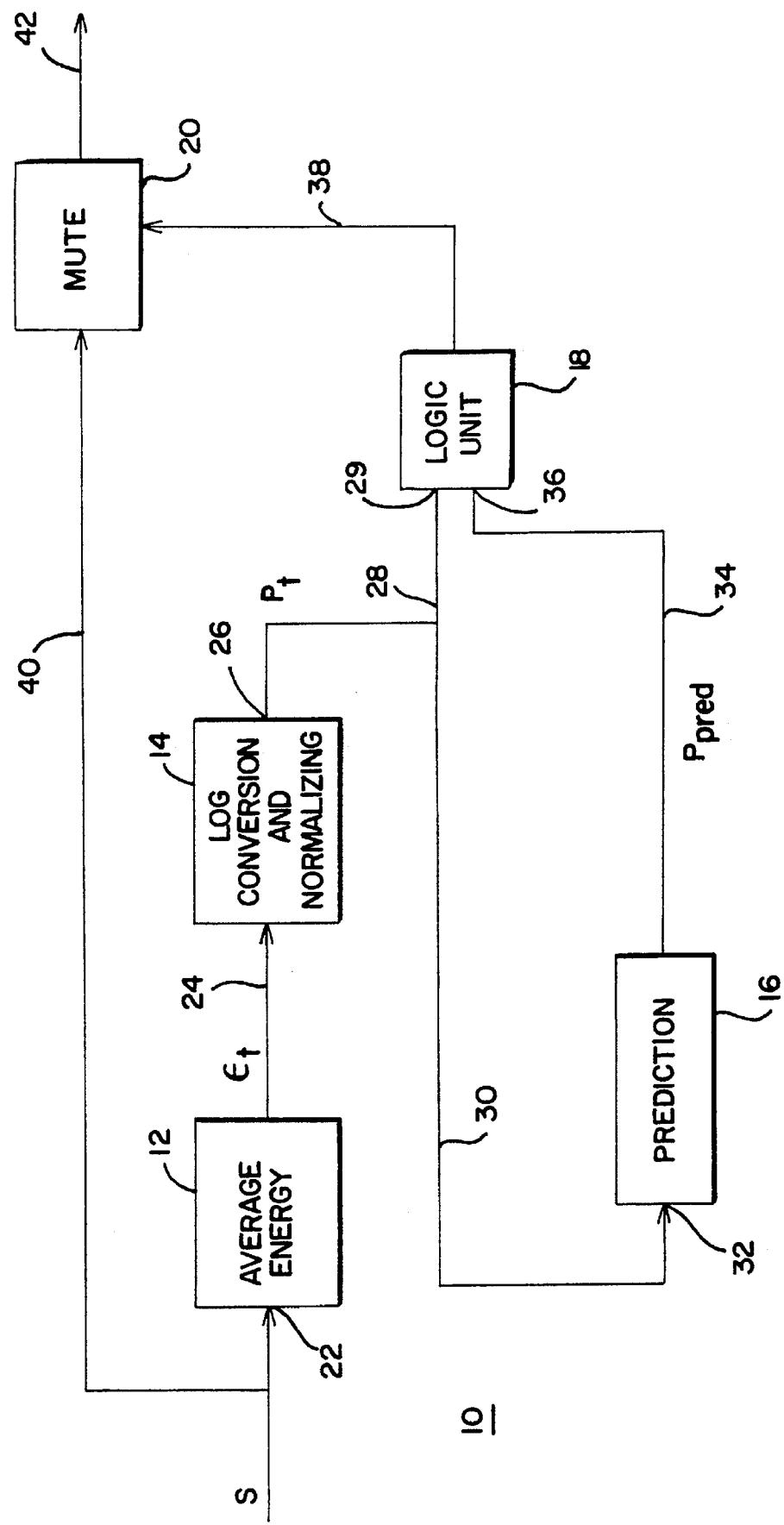
FIG. 1 is a schematic block diagram of the preferred embodiment of the apparatus of the present invention.

FIG. 1 is a schematic block diagram of the preferred embodiment of the apparatus of the present invention. In FIG. 1, an apparatus 10 for discriminating and suppressing noise within an incoming signal is illustrated as including an energy averaging unit 12, a log conversion and normalizing unit 14, a prediction unit 16, a logic unit 18, and a muting unit 20. The incoming signal s is received by energy averaging unit 12 at an input 22. Energy averaging unit 12 calculates an average signal energy $\epsilon_t$, preferably according to the relationship:

$$\epsilon_t = \frac{1}{n} \sum_{i=1}^{n} s_i^2$$

where $\epsilon_t$ = average signal energy, $s_i$ = $i^{th}$ sample of the incoming signal s, and n = number of samples.

Average signal energy $\epsilon_t$ is provided to log conversion and normalizing unit 14 via a line 24. Incoming signal s is preferably received in multi-bit digital format.

Log conversion and normalizing unit 14 performs a conversion of average signal energy $\epsilon t$, preferably according to the known relationship:

$$P_t = 10 \log_{10} \left( \frac{\epsilon_t}{\epsilon_{max}} \right)$$

where $P_t$ = average signal energy normalized with respect to maximum signal energy, $\epsilon_t$ = average signal energy, and $\epsilon_{max}$ = maximum expected signal energy.

Thus, log conversion and normalizing unit 14 provides at an output 26 the quantity $P_t$ (expressed in decibels (db)) representing average signal energy $\epsilon_t$ normalized with respect to maximum signal energy $\epsilon_{max}$ expected to be received by apparatus 10. Normalized average signal energy $P_t$ is conveyed via a line 28 to a first input 29 of logic unit 18, and is conveyed via a line 30 to an input 32 of prediction unit 16. Prediction unit 16 generates a predicted normalized average signal energy $P_{pred}$, preferably according to the relationship:

$$P_{pred} = \sum_{i=1}^{n} \beta_i P_i$$

where $P_{pred}$ = predicted average signal energy normalized to maximum expected signal energy of said incoming signal, $\beta_i$ = a scaling factor, $P_i$ = $i^{th}$ sample of normalized average signal energy, and n = number of samples.

Prediction unit 16 conveys the value of $P_{pred}$ via a line 34 to a second input 36 of logic unit 18. The manner by which prediction unit 16 calculates the value $P_{pred}$ will be discussed in greater detail hereinafter in connection with FIG. 3.

Logic unit 18 calculates a prediction error measurement (PEM). As an initial step, logic unit 18 calculates a prediction error (PE), preferably according to the relationship:

$$PE = P_t - P_{pred}$$

where $P_t$ and $P_{pred}$ are both expressed as logarithmic numbers.

Normalized average signal energy $P_t$ is logically treated by logic unit 18 and is normalized to actual error to obtain a prediction error measurement (PEM), preferably according to the relationship:

$$PEM = 10 \log_{10} \left( \frac{P_t^2}{(P_t - P_{pred})^2} \right) = 10 \log_{10} \left[ \frac{P_t^2}{PE^2} \right]$$

where $P_t$ and $P_{pred}$ are logarithmic numbers.

PEM is compared with a predetermined threshold, for example 8 db, so that if PEM exceeds the predetermined threshold, it is assumed that incoming signal s contains speech information, and if PEM is less than the predetermined threshold, it is assumed that incoming signal s contains noise information. Thus, muting unit 20 receives a logic output representing PEM via a line 38 from logic unit 18. Muting unit 20 also receives incoming signal s via a line 40. Muting unit 20 responds to the logic output signal received on line 38 to effect muting on incoming signal s received via line 40 when the logic output signal received via line 38 indicates that incoming signal s contains noise; i.e., when PEM is less than the predetermined threshold. Similarly, muting unit 20 effects no muting of incoming signal s when the logic output signal received via line 38 indicates that incoming signal s contains speech information; i.e., when PEM exceeds the predetermined threshold. Muting unit 20 provides an output signal on a line 42, which output signal is either a muted or non-muted signal, depending upon the value of the logic output signal received by muting unit 20 via line 38 from logic unit 18.

Thus, apparatus 10 performs a noise discriminating function and a noise suppressing function. When apparatus 10 determines that incoming signal s contains noise, it effects muting of incoming signal s until it is later determined that incoming signal s contains speech information, at which time muting of incoming signal s may be discontinued. Alternatively, muting may be effected for a predetermined muting period (e.g., 256 clock cycles) on each occasion of noise detection, and a recheck for presence of noise may be conducted after each such muting period expires to determine anew whether to impose muting for a succeeding muting period.

Apparatus 10 is based upon a signal energy prediction and upon an assumption that during normal speech the average signal energy varies relatively slowly but channel noise often causes the decoder (from which incoming signal s is received by apparatus 10) to become unstable resulting in a large increase in decoded signal energy in a much shorter time than is experienced when incoming signal s contains speech information. It is this rapid and large increase in energy which is perceived as unpleasant clicks or pops by a user.

During normal speech, the relatively slowly-varying signal energy of incoming signal s can be predicted relatively accurately. However, when the decoder becomes unstable (as when noise is present) the energy prediction error has generally been large with prior art devices. Apparatus 10 detects the onset of a noise burst whenever the prediction error measurement (PEM) is less than a predetermined threshold. The choice of the threshold directly affects performance and responsiveness of the system, and is generally determined empirically.

Instead of relying upon a predetermined muting period to effect noise reduction, it may be advantageous to detect the termination of a noise burst, a burst end, to determine when to cease muting. To detect a burst end, apparatus 10 may track the slope of a quantizer step size which is calculated simply as the average difference of signal energy (or another parameter related to signal energy) over some interval. This slope is compared to a threshold and, if the slope is more negative than the threshold, then the end of an error burst is determined to have occurred. Once such a burst end is detected, muting may be terminated or may be continued for a short interval in order to ensure full recovery of the decoder before discontinuing muting. The optimum interval for such extended muting is preferably determined empirically.

Figure 2:
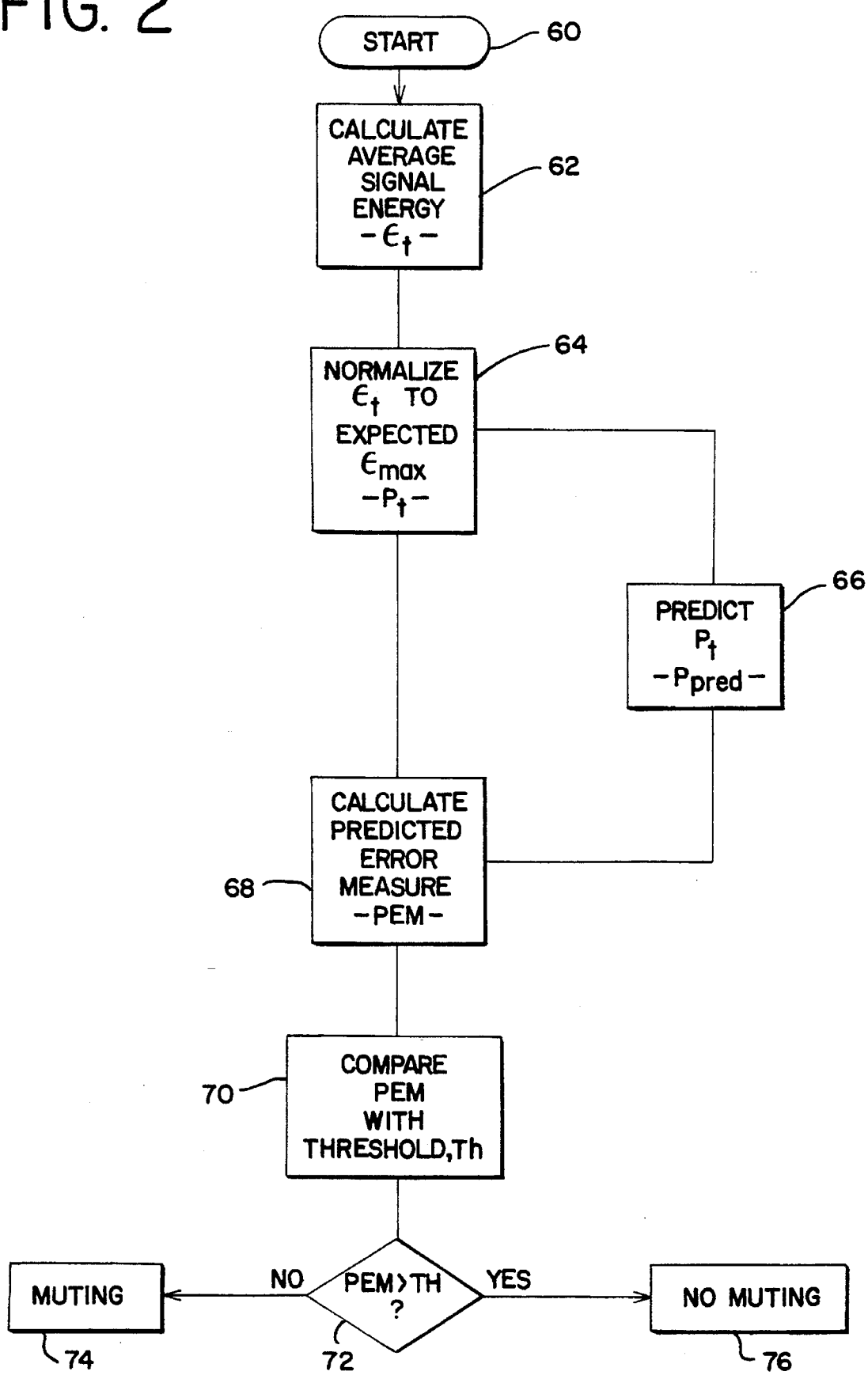
FIG. 2 is a flow diagram illustrating the preferred embodiment of the method of the present invention.

FIG. 2 is a flow diagram illustrating the preferred embodiment of the method of the present invention. In FIG. 2, the method starts at a block 60 with reception of incoming signal s (see FIG. 1), and average signal energy $\epsilon_t$ is calculated (Block 62) as a function of incoming signal energy s, preferably according to the relationship:

$$\epsilon_t = \frac{1}{n} \sum_{i=0}^{n} s_i^2$$

where $\epsilon_t$=average signal energy, $s_i=i^{th}$ sample of said incoming signal, and n=number of samples.

Then there is calculated (Block 64) a normalized average signal energy $P_t$, preferably according to the relationship:

$$P_t = 10\log_{10}\left(\frac{\epsilon_t}{\epsilon_{max}}\right)$$

where $P_t$=average signal energy normalized with respect to maximum signal energy, $\epsilon_t$=average signal energy, and $\epsilon_{max}$=maximum expected signal energy.

A predicted value of the normalized average signal energy $P_{pred}$ is calculated (Block 66), preferably according to the following relationship:

$$P_{pred} = \sum_{i=1}^{n} \beta_i P_i$$

where $P_{pred}$=predicted average signal energy normalized to maximum expected signal energy of said incoming signal, $\beta_i$=a scaling factor, $P_i=i^{th}$ sample of normalized average signal energy, and n=number of samples.

In the preferred embodiment, it has been found sufficient for the needs of a wireless telephone application to employ a value of 4 for the number of samples n, and to employ predetermined constants for the values of scaling factors $\beta_i$.

A prediction error (PE) is calculated, preferably according to the expression:

$$PE = P_t - P_{pred}$$

and PE is used to normalize the average signal energy to determine a predicted error measure (PEM) (Block 68), preferably according to the expression:

$$PEM = 10\log_{10}\left(\frac{P_t^2}{(P_t - P_{pred})^2}\right)$$

PEM is compared with a predetermined threshold value (Block 70) to generate a logic output signal reflecting that comparison; the logic output value has a first value when PEM exceeds the predetermined threshold value, thereby indicating the presence of speech in incoming signal s; and the logic output signal has a second value when PEM is less than the predetermined threshold, thereby indicating the presence of noise in incoming signal s (Block 72). Thus, incoming signal s is muted by a muting device when the logic output signal indicates the presence of noise in incoming signal s (Block 74). When the logic output signal indicates the presence of speech in incoming signal s, the muting device effects no muting of incoming signal s (Block 76).

Figure 3:
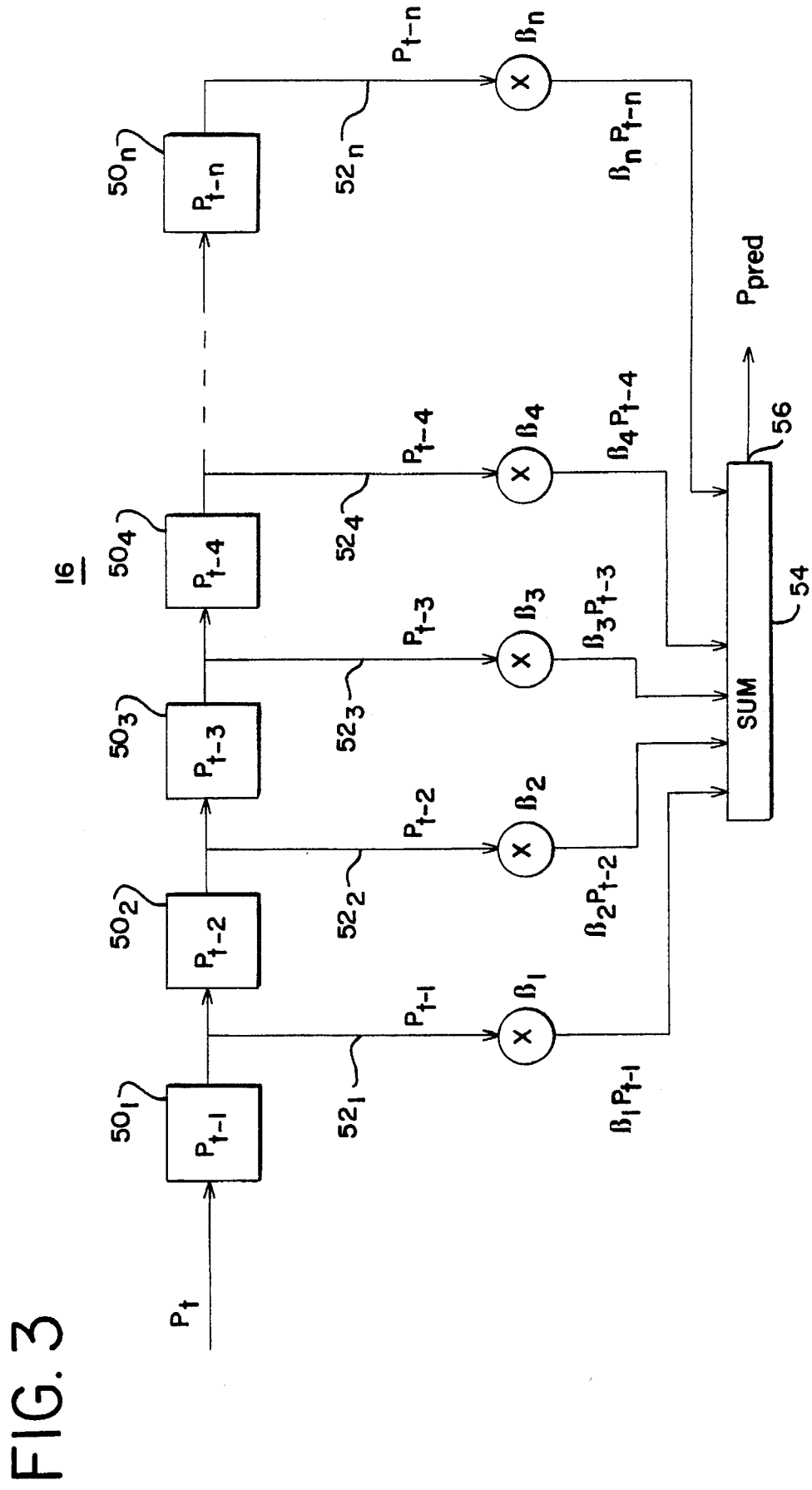
FIG. 3 is a schematic block diagram of the preferred embodiment of the prediction unit of the present invention.

FIG. 3 is a schematic block diagram of the preferred embodiment of the prediction unit of the present invention. In FIG. 3, a prediction unit 16 is illustrated as a multistage digital filter comprising a plurality of delay units $50_1$, $50_2$, $50_3$, $50_4$, . . . $50_n$. Each delay unit $50_i$ delays the received signal $P_t$ (normalized average signal energy) by an additional time period so that an output line $52_1$ conveys the received signal delayed one time period, $P_{t-1}$; output line $52_2$ conveys the received signal delayed by two time periods, $P_{t-2}$; output line $52_3$ conveys the received signal delayed three time units, $P_{t-3}$; output line $52_4$ conveys the received signal delayed by four time units, $P_{t-4}$; and output line $52_n$ conveys the received signal delayed by n time units, $P_{t-n}$.

Each of the respective output signals $P_{t-i}$ conveyed by output lines $52_i$ are respectively multiplied by a scaling factor $\beta_i$ so that output signal $P_{t-1}$ is multiplied by scaling factor $\beta_1$, output signal $P_{t-2}$ is multiplied by scaling factor $\beta_2$, output signal $P_{t-3}$ is multiplied by scaling factor $\beta_3$, output signal $P_{t-4}$ is multiplied by scaling factor $\beta_4$, and output signal $P_{t-n}$ is multiplied by scaling factor $\beta_n$. The resultant scaled output signals $\beta_i P_{t-i}$ are summed in a summer 54 which provides at an output 56 a predicted value $P_{pred}$ for normalized average signal energy $P_t$ based upon a plurality of earlier samples $P_{t-i}$ of $P_t$.

It is to be understood that, while the detailed drawing and specific examples given describe preferred embodiments of the invention, they are for the purpose of illustration, that the apparatus of the invention is not limited to the precise details and conditions disclosed and that various changes may be made therein without departing from the spirit of the invention which is defined by the following claims:

What is claimed is:

1. An apparatus for discriminating and suppressing noise within an incoming signal, the apparatus comprising:

a first signal processing means for processing said incoming signal to generate a first iteration signal, said first iteration signal being representative of a first predetermined parameter of said incoming signal;

a second signal processing means for processing said first iteration signal to generate a second iteration signal, said second iteration signal being representative of a second predetermined parameter of said first iteration signal;

a prediction means for generating a predicted value for said second iteration signal based on a plurality of earlier samples of said second iteration signal;

a logic means for determining a difference between said second iteration signal and said predicted value, said logic means generating a logic output, said logic output having a first value when said difference exceeds a predetermined threshold value, said logic output having a second value when said difference does not exceed said predetermined threshold value; and a muting means for muting signals; said muting means being operatively connected to receive said incoming signal and said logic output, said muting means responding to said logic output to mute said incoming signal when said logic output is at one of said first value and said second value, said muting means responding to said logic output to not mute said incoming signal when said logic output is at the other of said first value and said second value.

2. An apparatus for discriminating and suppressing noise within an incoming signal as recited in claim 1 wherein said first iteration signal represents average signal energy of said incoming signal.

3. An apparatus for discriminating and suppressing noise within an incoming signal as recited in claim 1 wherein said second iteration signal comprises said first iteration signal normalized with respect to a predetermined value.

4. An apparatus for discriminating and suppressing noise within an incoming signal as recited in claim 3 wherein said predetermined value is a maximum value expected for said first iteration signal.

5. An apparatus for discriminating and suppressing noise within an incoming signal as recited in claim 4 wherein said second iteration signal represents a logarithmic expression.

6. An apparatus for discriminating and suppressing noise within an incoming signal as recited in claim 2 wherein said second iteration signal comprises said first iteration signal normalized with respect to a predetermined value.

7. An apparatus for discriminating and suppressing noise within an incoming signal as recited in claim 6 wherein said predetermined value is a maximum value expected for said first iteration signal.

8. An apparatus for discriminating and suppressing noise within an incoming signal as recited in claim 7 wherein said second iteration signal represents a logarithmic expression.

9. An apparatus for discriminating and suppressing noise within an incoming signal as recited in claim 2 wherein said first signal processing means effects an averaging algorithm in the form:

$$\epsilon_t = \frac{1}{n} \sum_{i=1}^{n} s_i^2$$

where $\epsilon_t$=average signal energy, $s_i$=$i^{th}$ sample of said incoming signal, and n=number of samples.

10. An apparatus for discriminating and suppressing noise within an incoming signal as recited in claim 3 wherein said second signal processing means effects a normalizing algorithm in the form:

$$P_t = 10\log_{10}\left(\frac{\epsilon_t}{\epsilon_{max}}\right)$$

where $P_t$=average signal energy normalized with respect to maximum signal energy, $\epsilon_t$=average signal energy, and $\epsilon_{max}$=maximum signal energy.

11. An apparatus for discriminating and suppressing noise within an incoming signal as recited in claim 1 wherein said prediction means comprises a digital filter, said digital filter having at least as many taps as said plurality of earlier samples.

12. An apparatus for discriminating and suppressing noise within an incoming signal as recited in claim 9 wherein said second signal processing means effects a normalizing algorithm in the form:

$$P_t = 10\log_{10}\left(\frac{\epsilon_t}{\epsilon_{max}}\right)$$

where $P_t$=average signal energy normalized with respect to maximum signal energy, $\epsilon_t$=average signal energy, and $\epsilon_{max}$=maximum signal energy.

13. An apparatus for discriminating and suppressing noise within an incoming signal as recited in claim 9 wherein said prediction means comprises a digital filter, said digital filter having at least as many taps as said plurality of earlier samples.

14. An apparatus for discriminating and suppressing noise within an incoming signal as recited in claim 10 wherein said prediction means comprises a digital filter, said digital filter having at least as many taps as said plurality of earlier samples.

15. An apparatus for discriminating and suppressing noise within an incoming signal as recited in claim 12 wherein said prediction means comprises a digital filter, said digital filter having at least as many taps as said plurality of earlier samples.

16. A method for discriminating and suppressing noise within an incoming signal, the method comprising the steps of:

(a) generating a first iteration signal, said first iteration signal being representative of average signal energy of said incoming signal;

(b) generating a second iteration signal, said second iteration signal being representative of said first iteration signal normalized with respect to a maximum signal energy expected for said incoming signal;

(c) generating a predicted value for said second iteration signal based on a plurality of earlier samples of said second iteration signal;

(d) determining a difference between said second iteration signal and said predicted value;

(e) generating a control signal, said control signal having a first value when said difference exceeds a predetermined threshold value, said control signal having a second value when said difference does not exceed said predetermined threshold value; and (f) providing a muting means for muting signals; said muting means being operatively connected to receive said incoming signal and said control signal, said muting means responding to said control signal to mute said incoming signal when said control signal is at one of said first value and said second value, said muting means responding to said control signal to not mute said incoming signal when said control signal is at the other of said first value and said second value.

17. A method for discriminating and suppressing noise within an incoming signal as recited in claim 16 wherein said first iteration signal is generated according to the relationship:

$$\epsilon_t = \frac{1}{n} \sum_{i=1}^{n} s_i^2$$

where $\epsilon_t$=average signal energy, $s_i=i^{th}$ sample of said incoming signal, and n=number of samples.

18. A method for discriminating and suppressing noise within an incoming signal as recited in claim 16 wherein said second iteration signal is generated according to the relationship:

$$P_t = 10\log_{10}\left(\frac{\epsilon_t}{\epsilon_{max}}\right)$$

where $P_t$=average signal energy normalized with respect to maximum signal energy, $\epsilon_t$=average signal energy, and $\epsilon_{max}$=maximum signal energy.

19. A method for discriminating and suppressing noise within an incoming signal as recited in claim 16 wherein said predicted value is generated according to the relationship:

$$P_{pred} = \sum_{i=1}^{n} \beta_i P_i$$

where $P_{pred}$=predicted average signal energy normalized to maximum expected signal energy of said incoming signal, $\beta_i$=a scaling factor, $P_i=i^{th}$ sample of normalized average signal energy, and n=number of samples.

20. A method for discriminating and suppressing noise within an incoming signal as recited in claim 17 wherein said second iteration signal is generated according to the relationship:

$$P_t = 10\log_{10}\left(\frac{\epsilon_t}{\epsilon_{max}}\right)$$

where $P_t$=average signal energy normalized with respect to maximum signal energy, $\epsilon_t$=average signal energy, and $\epsilon_{max}$=maximum signal energy.

21. A method for discriminating and suppressing noise within an incoming signal as recited in claim 17 wherein said predicted value is generated according to the relationship:

$$P_{pred} = \sum_{i=1}^{n} \beta_i P_i$$

where $P_{pred}$=predicted average signal energy normalized to maximum expected signal energy of said incoming signal, $\beta_i$=a scaling factor, and $P_i=i^{th}$ sample of normalized average signal energy.

22. A method for discriminating and suppressing noise within an incoming signal as recited in claim 18 wherein said predicted value is generated according to the relationship:

$$P_{pred} = \sum_{i=1}^{n} \beta_i P_i$$

where $P_{pred}$=predicted average signal energy normalized to maximum expected signal energy of said incoming signal, $\beta_i$=a scaling factor, and $P_i=i^{th}$ sample of normalized average signal energy.

23. An apparatus for discriminating and suppressing noise within an incoming signal, the apparatus comprising:

a first signal processing means for processing said incoming signal to generate a first iteration signal, said first iteration signal representing average signal energy of said incoming signal, said first signal processing means effecting an averaging algorithm in the form:

$$\epsilon_t = \frac{1}{n} \sum_{i=1}^{n} s_i^2$$

where $\epsilon_t$=average signal energy, $s_i=i^{th}$ sample of said incoming signal, and n=number of samples;

a second signal processing means for processing said first iteration signal to generate a second iteration signal, said second iteration signal being representative of a predetermined parameter of said first iteration signal;

a prediction means for generating a predicted value for said second iteration signal based on a plurality of earlier samples of said second iteration signal;

a logic means for determining a difference between said second iteration signal and said predicted value, said logic means generating a logic output, said logic output having a first value when said difference exceeds a predetermined threshold value, said logic output having a second value when said difference does not exceed said predetermined threshold value; and a muting means for muting signals; said muting means being operatively connected to receive said incoming signal and said logic output, said muting means responding to said logic output to mute said incoming signal when said logic output is at one of said first value and said second value, said muting means responding to said logic output to not mute said incoming signal when said logic output is at the other of said first value and said second value.

24. An apparatus for discriminating and suppressing noise within an incoming signal as recited in claim 23 wherein said second iteration signal comprises said first iteration signal normalized with respect to the maximum value expected for said first iteration signal, said second signal processing means effecting a normalizing algorithm in the form:

$$P_t = 10\log_{10}\left(\frac{\epsilon_t}{\epsilon_{max}}\right)$$

where $P_t$=average signal energy normalized with respect to maximum signal energy, $\epsilon_t$=average signal energy, and $\epsilon_{max}$=maximum signal energy.

25. An apparatus for discriminating and suppressing noise within an incoming signal as recited in claim 23 wherein said predicted value is generated according to the relationship:

$$P_{pred} = \sum_{i=1}^{n} \beta_i P_i$$

where $P_{pred}$=predicted average signal energy normalized to maximum expected signal energy of said incoming signal, $\beta_i$=a scaling factor, and $P_i=i^{th}$ sample of normalized average signal energy.

26. An apparatus for discriminating and suppressing noise within an incoming signal as recited in claim 24 wherein said predicted value is generated according to the relationship:

$$P_{pred} = \sum_{i=1}^{n} \beta_i P_i$$

where $P_{pred}$=predicted average signal energy normalized to maximum expected signal energy of said incoming signal, $\beta_i$=a scaling factor, and $P_i=i^{th}$ sample of normalized average signal energy.

27. An apparatus for discriminating and suppressing noise within an incoming signal as recited in claim 23 wherein said prediction means comprises a digital filter, said digital filter having at least as many taps as said plurality of earlier samples.

28. An apparatus for discriminating and suppressing noise within an incoming signal as recited in claim 24 wherein said prediction means comprises a digital filter, said digital filter having at least as many taps as said plurality of earlier samples.

29. An apparatus for discriminating and suppressing noise within an incoming signal as recited in claim 25 wherein said prediction means comprises a digital filter, said digital filter having at least as many taps as said plurality of earlier samples.

30. An apparatus for discriminating and suppressing noise within an incoming signal as recited in claim 26 wherein said prediction means comprises a digital filter, said digital filter having at least as many taps as said plurality of earlier samples.

\* \* \* \* \*